US00RE37619E

(19) United States
(12) Reissued Patent
Mercer et al.

(10) Patent Number: US RE37,619 E
(45) Date of Reissued Patent: Apr. 2, 2002

(54) SKEWLESS DIFFERENTIAL SWITCH AND DAC EMPLOYING THE SAME

(75) Inventors: Douglas A. Mercer, Bradford; David H. Robertson, Boxford, both of MA (US); Ernest T. Stroud, Greensboro, NC (US); David Reynolds, Dove Canyon, CA (US)

(73) Assignee: Analog Devices, Inc., Norwood, MA (US)

(21) Appl. No.: 09/441,319

(22) Filed: Nov. 16, 1999

(Under 37 CFR 1.47)

Related U.S. Patent Documents

Reissue of:
(64) Patent No.: 5,689,257
Issued: Nov. 18, 1997
Appl. No.: 08/583,410
Filed: Jan. 5, 1996

(51) Int. Cl.[7] ..... H03K 3/2885
(52) U.S. Cl. ..... 341/133; 341/144; 327/51
(58) Field of Search ..... 341/133, 144, 341/143, 145, 150; 327/51, 106

(56) References Cited

U.S. PATENT DOCUMENTS 4,629,909 A * 12/1986 Cameron ..... 341/133
5,105,193 A 4/1992 Vogt et al. ..... 341/154
5,450,084 A 9/1995 Mercer ..... 341/153

OTHER PUBLICATIONS

Daniel H. Sheingold et., Analog–to–Digital Conversion Handbook, Prentice Hall, Englewood Cliffs, New Jersey, 1986, pp. 191–206.*

Paul Horowitz, Winfield Hill, The Art of Electronics, Cambridge University Press, New York, 1989, pp. 142–143.*

"A 20–Gb/s Flip–Flop Circuit Using Direct–Coupled FET Logic", IEEE Journal of Solid State Circuits, vol. 28. No. 10, Oct. 1993, pp. 1046–1051.*

* cited by examiner

*Primary Examiner*—Peguy JeanPierre
(74) *Attorney, Agent, or Firm*—Koppel & Jacobs

(57) ABSTRACT

A differential switch accepts a binary control signal and its complement (which may be skewed with respect to the control signal) and latches both signals simultaneously. The latched output signals drive the control terminals of a differential switch pair which connects one of two terminals to a third terminal, depending upon the state of the control terminals. The differential switch may optionally include an inverter which complements the binary control signal, thus eliminating the need for external inversion of the control signal. The switch is particularly applicable for use in a digital to analog converter.

25 Claims, 4 Drawing Sheets

FIG.5A
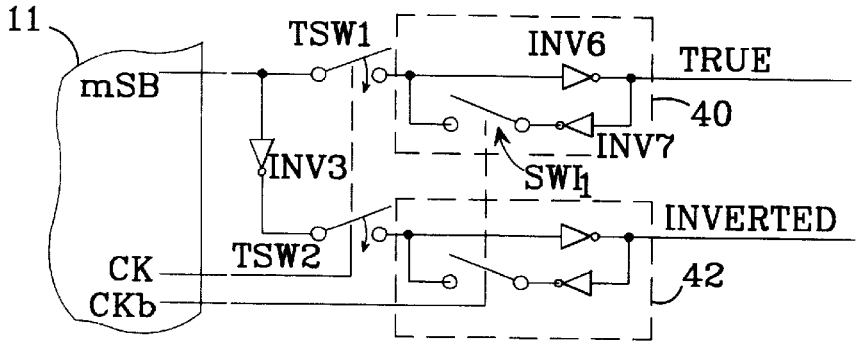
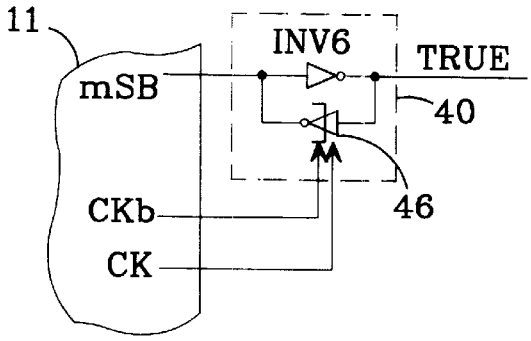
FIG.5B
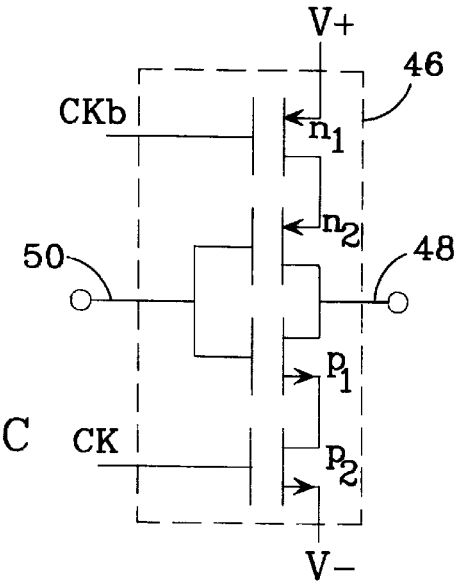
FIG.5C
FIG.5D
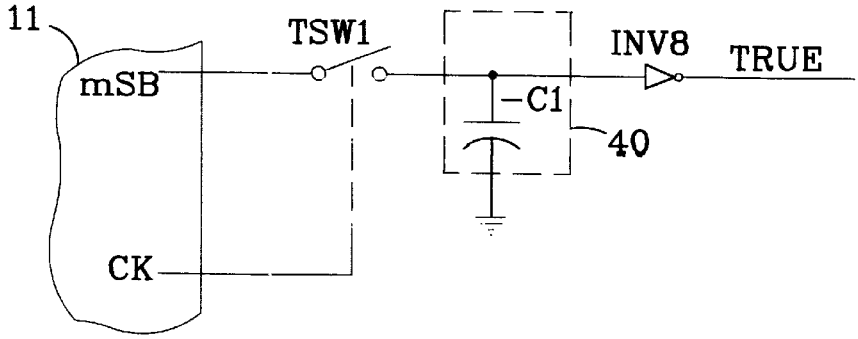

SKEWLESS DIFFERENTIAL SWITCH AND DAC EMPLOYING THE SAME

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates to the field of differential switches and, in particular, to differential switches operated under control of a single binary signal, as in the case of digital to analog converters (DACs).

2. Description of the Related Art

Binary-control differential switches operate as single-pole double-throw switches and are employed in many applications such as DACs. Within such a switch, a single control terminal effects contact between a first conducting terminal and a second conducting terminal while breaking contact between the first conducting terminal and a third conducting terminal. Although the utility of such switches will be described in reference to their application within DACs, they may be used for many other applications.

There are a number of conventional DAC architectures which employ differential switches. Some are current output, some are voltage output. For examples of both see, *Analog-Digital Conversion Handbook,* Daniel H. Sheingold ed., Prentice Hall, Englewood Cliffs, N.J., 1986, pages 191–206. A current output DAC is illustrated in FIG. 1, but the new switches are applicable to voltage output DACs as well. Generally, a DAC is a device which converts a quantity specified as a binary number (this includes BCD, two's complement and other binary codes) into a current or voltage which is proportional to the value of the digital input. The digital input is typically held in a digital section 11 which may receive the digital input either serially or in parallel through a digital interface 13. The binary number thus stored typically controls an analog output section 15 which comprises a set of differential switches S1–Sn, with each bit of the binary number controlling which one of two terminals within an associated differential switch S1–Sn is connected to a third terminal within the switch. In some cases a single switch is employed to "build up" an analog signal over some period of time.

More specifically, in the design of FIG. 1, an array of differential switches S1–Sn connect binarily-weighted current sources I1–In to either a return, or reference, terminal 10 or output terminal 12 under control, respectively, of binary control inputs from the least significant bit LSB 14 to the most significant bit MSB 18. Current for the sources I1–In is provided through terminal 9. The sum of the currents appearing at the output terminal 12 provide a "stair step" approximation to the continuous signal represented by the binary control inputs MSB–LSB. Alternatively, the reference terminal 10 and output terminal 12 could be connected to high and low voltage references and the terminal 9 would then provide a voltage output. In this case, the taps of a resistor ladder are connected in place of the current sources I1–In.

As the binary values at the control inputs LSB–MSB vary, the switches S1–Sn route currents corresponding to the varying binary values of the control inputs to the output terminal, where the total current may be converted into a voltage. The switches are generally switched "simultaneously" to provide valid current levels at the output terminal 12. However, as will be explained in greater detail in relation to FIG. 2, there is often a delay introduced between the "make" and "break" actions of the switches S1–Sn, causing spurious signals, or "glitches", to appear at the output terminal 12.

The mid-scale glitch, produced by the transition of the control codes appearing at terminals 18–14 between 1000 . . . 0 and 0111 . . . 1, is usually the worst glitch because all the switches S1–Sn are switching at this transition. Glitches will also occur at other transition points, but they will generally be of lesser magnitude. Glitches are particularly onerous in waveform reconstruction applications such as direct digital synthesis systems.

Code-dependent glitches, such as those just discussed, will produce both out-of-band and in-band harmonics of the desired signal. For example, in reconstructing a sine wave, the midscale glitch occurs twice during each sine wave period, at each mid-scale crossing. In this manner the midscale glitches produce a second harmonic of the sinewave. Although filtering may eliminate or reduce to a tolerable level the contribution from some of the glitches, higher order harmonics, which alias back into the Nyquist bandwidth, cannot be filtered. To avoid filtering and to eliminate spurious signals that cannot be filtered, it would therefore be desirable to avoid introducing the glitches whenever possible.

The block diagram of FIG. 2A provides a more detailed view of a typical conventional switch, which may be employed as one of switches S1–Sn of FIG. 1. As an example, switch S1 includes a differential switch pair 20, comprising switches swa and swb, which connect either terminal a or b to terminal c. Control terminals T and I are connected to receive complementary control signals developed within a latch L1. The latch L1 accepts the binary control signal MSB and converts it into a complementary pair of control signals for use with the differential pair swa and swb. The utility of the latch L1 derives from the fact that, at a system level, whatever device is driving, or controlling, the DAC, in all probability has other duties to perform and may address those other duties only if it stores its required digital patterns within the switches S1–Sn, and then proceeds to other operations.

The control input MSB provides a digital signal path for control inputs to the switch S1. An MSB signal enters the latch L1 and, under control of enable signals ck and ckb, is transferred through an analog switch ASW1. It is then inverted, or complemented, by an inverter INV1 to produce a control signal INVERTED which is applied to the control terminal of the switch swb. Analog switches are known in the art. A description of them may be found in, Paul Horowitz, and Winfield Hill, *The Art of Electronics,* Cambridge University Press, N. Y., 1989, pages 142–143. The output of the inverter INV1 is connected to the input of a second inverter INV2 which inverts the signal INVERTED to produce a control signal TRUE which is applied to the control input 24 of the switch swb, the other switch of the differential pair. Note that inversion of the INVERTED signal by inverter INV2 produces a delay between the control signals applied to the differential pair. That is, the INVERTED signal will arrive at the control terminal 22 of switch swb one inverter's delay before the TRUE signal arrives at the control terminal 24 of switch swa. Consequently, a glitch impulse will be created at the S1 output terminal c.

Returning to the operation of the latch L1, the enable signals ck and ckb are assumed to be complementary and non-overlapping. That is, more circuitry than a simple inverter is required to produce ckb from ck. During a first phase of the enable signals ck and ckb, the input signal from MSB is "clocked" through the analog switch ASW1. At the same time, because the control inputs to analog switch ASW2 are connected opposite to the connection of ASW1, ASW2 will be "off", thus isolating the output of ASW1 from the output of the inverter INV2.

However, during the second phase of the enable signals, analog switch ASW1 is off and ASW2 is on. With ASW1 off, the MSB terminal is isolated from the circuit beyond the analog switch ASW1. With analog switch ASW2 on, inverters INV1 and INV2 are "cross-coupled". That is, the output of INV1 feeds the input of INV2 and the output of INV2 feeds the input of INV1. In this conventional configuration, there are two stable states which the inverters may assume, i.e., INV1=1, INV2=0 or INV1=0, INV2=1 and, by feedback, they will remain in whichever state to which they are forced. In this way the cross-coupled inverters, coupled through the switches ASW1 and ASW2, form a latch which provides TRUE(delayed) and INVERTED control signals for a differential switch pair from a single binary control signal i.e., that from the MSB terminal.

The switches swa and swb which comprise the differential pair may be any type of switch, including p-channel or n-channel MOSFETs, NPN or PNP bipolar transistor or analog switches. Employing analog switches for switches swa and swb provides some flexibility in choosing between current output or voltage output DACs. An implementation which employs PNP transistors as switches swa and swb is illustrated in FIG. 2B, for example. The emitters of two PNP transistors are connected to a current source such as I1 in FIG. 1 A single control signal, e.g. MSB, is converted to a differential pair of control signals and applied to the respective control terminals 22 and 24, i.e. the bases, of the transistors. With complementary control signals, only one of the transistors will conduct at a given time(ideally), switching current, for example, from the current source I1 into either a return 10 or output 12 path.

An analog switch implementation of the differential switch pair, illustrated in FIG. 2C, operates substantially the same as the PNP transistor pair of FIG. 2B. Differential control signals derived from a control input such as MSB are applied, cross-coupled, to the inverting and non-inverting control inputs of two analog switches. One input, or switch contact, of each analog switch is connected to a current source, the other input is connected to the return terminal 10, the other input of swb is connected to output terminal 12. Ideally, the differential control signals place only one of the switches in the conduction mode at a time, thereby switching current from the current source either into the return path or into the output 12 path. However, as described above, the delay between control signals TRUE and INVERTED sometimes place both switches swa and swb into conduction at the same time.

The advantage of employing analog switches for switches swa and swb lies in the fact that they conduct bidirectionally; therefore a voltage output may be produced by substituting voltage references at the return 10 and output 12 terminals and taking the output from the terminal 14 which, in the current output configuration, provides the reference current I1.

Another latch may be added "in front of" L1 to produce a conventional master/slave latch which provides added isolation between input and output. This additional level of isolation may be used, for example, to update a binary input value by shifting a desired binary value into position at the inputs to a set of master latches, keeping the slave latches isolated, then shifting the updated value into the slave latches simultaneously.

As just described, conventional switches require a somewhat elaborate scheme to produce non-overlapping complementary enable signals to drive the control inputs of analog switches which, along with a pair of inverters, form a binary to differential control latch. Not only is an elaborate enable signal required, glitches, which may create unfilterable spurious signals, are produced by the delay between the generation of TRUE and INVERTED control signals for the differential switch pair.

SUMMARY OF THE INVENTION

The invention is directed to a differential switch that minimizes the complexity of a switch controller's clock generation circuitry and reduces spurious switching, thereby reducing the occurrence and duration of undesirable switch outputs, or glitches. These goals are achieved by a latched differential switch which inverts the control input and then simultaneously transfers the control input and its complement through transfer switches into storage elements. Although inverting the control signal introduces a delay between the control signal and its complement (referred to as the "TRUE" and "INVERTED" signals hereinafter), simultaneously transferring them into storage elements eliminates this skew. The storage elements' outputs are connected to the control inputs of a differential switch pair, thus providing "de-skewed" control for a differential switch pair from a single binary control input.

In one implementation, the novel switch includes a n intermediate set of transfer switches, operated from the same "enable" signal as the first set of transfer switches, and an intermediate set of storage elements. The intermediate sets of switches and storage elements are interposed between the TRUE and INVERTED inputs and the first set of transfer switches. During the first cycle of the enable signal, the TRUE and INVERTED signals are simultaneously transferred into the intermediate set of storage elements. As described above, this simultaneous transfer eliminates the skew between the TRUE and INVERTED signals. The TRUE and INVERTED signals are then transferred into the first storage element, which is isolated from the intermediate storage element, during the second cycle of the enable signal.

The isolation between the first and second storage elements prevents transitions at the input to the second storage element from appearing at the first storage element. The TRUE and INVERTED signals are therefore available from the second storage element without the skew between them that had been introduced by inverting the control signal. The outputs of the first storage element are connected, as described above, to the control inputs of a differential switch pair, thus providing "de-skewed" control for the switch pair. The novel switch may be used, for example, within a DAC to reduce the DAC's glitch energy output.

These and other features, aspects and advantages of the invention will be apparent to those skilled in the art from the following detailed description, take together with the accompanying drawings.

BRIEF DESCRIPTION OF THE DRAWINGS

FIG. 5A is a schematic diagram illustrating "switched" cross-coupled inverters, which may be used as the novel switch's storage elements.

FIG. 5B is a schematic diagram illustrating a gated inverter employed as one of a cross-coupled inverter pair, which may be used as one of the novel switch's storage elements.

FIG. 5C is a detailed schematic diagram of a gated inverter such as illustrated in FIG. 5B.

FIG. 5D is a schematic diagram illustrating the use of a capacitor as a storage element within the novel switch.

DETAILED DESCRIPTION OF THE INVENTION

Figure 1:
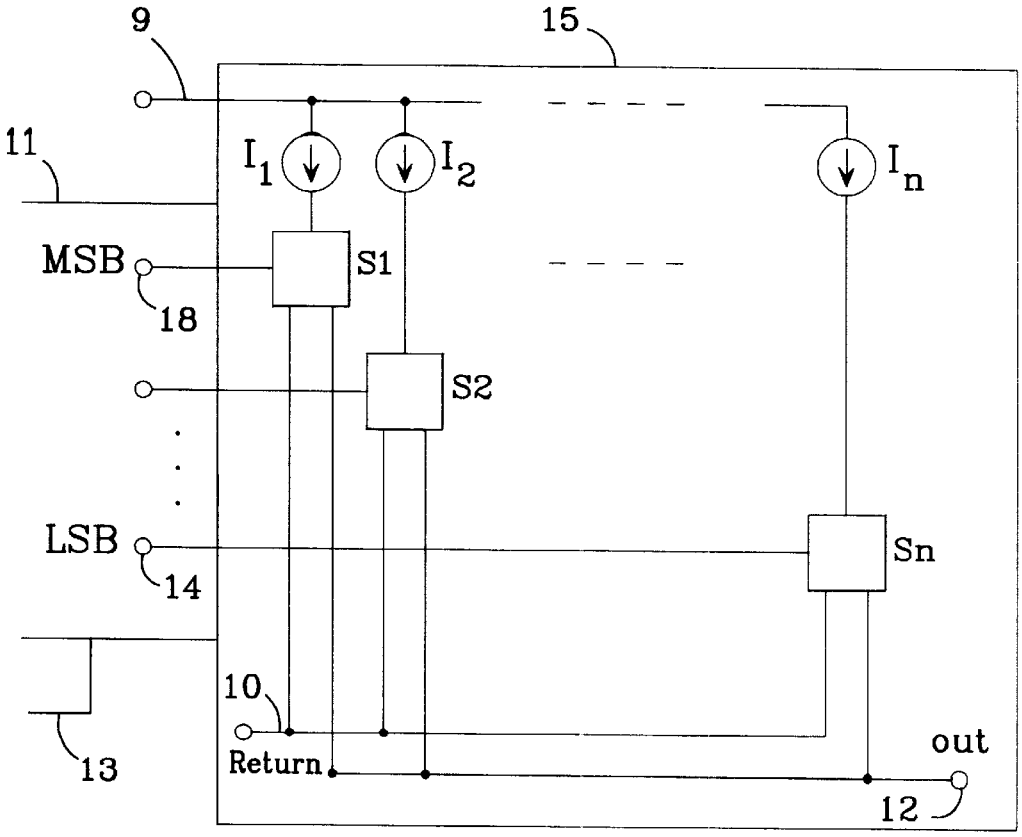
FIG.1 (Prior Art)
FIG. 1 is a block diagram, described above, of the interconnections between control bits, differential switches and current sources within a conventional DAC.
Figure 3:
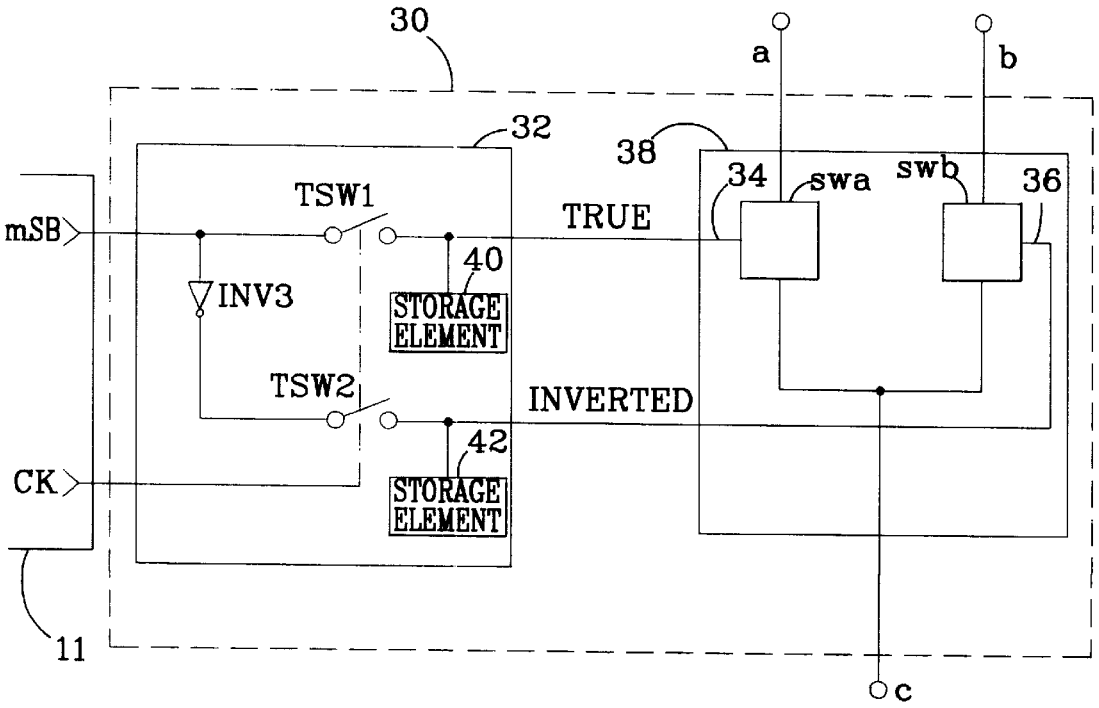
FIG. 3 is a block diagram of a preferred embodiment of the new differential switch provided by the invention, illustrating the switch's latch and the latch's inter-connection with a differential switch pair.

The new switch 30 of FIG. 3 may be employed within a DAC, for example, as one of the differential switches S1–Sn illustrated in FIG. 1. The new switch 30 comprises a latch 32 with a binary input MSB and enable input ck. The latch 32 accepts a single binary signal at an MSB input, and produces de-skewed TRUE and INVERTED control signals at like-named outputs. These outputs are connected to the control terminals 34 and 36 of a conventional differential switch pair 38 which may be compose, for example, as described in the background section, of NPN or PNP bipolar transistors, N-channel of P-channel MOSFETs or CMOS analog switches.

The latch 32 accepts a binary signal at the input MSB, inverts the signal with an inverter INV3 and, under control of transfer switches TSW1 and TSW2, transfers the TRUE and INVERTED signals thus produced into storage elements 40 and 42. Outputs from the storage elements 40 and 42 are connected to the control inputs 34 and 36 of a differential switch pair comprising switches swa and swb. The enable signal ck controls the simultaneous transfer of TRUE and INVERTED control signals into storage elements 40 and 42, respectively. Although the inverter INV3 introduces a skew between the TRUE and INVERTED signals as it produces the INVERTED signal from the TRUE signal, the simultaneous transfer of these signals into the storage elements eliminates this skew. In some applications, TRUE and INVERTED signals may be available as inputs to the novel switch(with an inverter's delay between them). In those cases, the inverter INV3 could be eliminated from the switch 30.

As indicated in FIG. 3, the control signals TRUE and INVERTED are available at the control terminals 34 and 36 of the differential switch pair coincident with their transfer into the storage elements 40 and 42. Once these signals are stored and are providing control over the differential switch pair, the transfer switches TSW1 and TSW2 are opened to provide isolation from the input MSB which may be subject to modification of its logic state due to the transfer of data into a DAC of which the novel switch 30 is a part.

Figure 4:
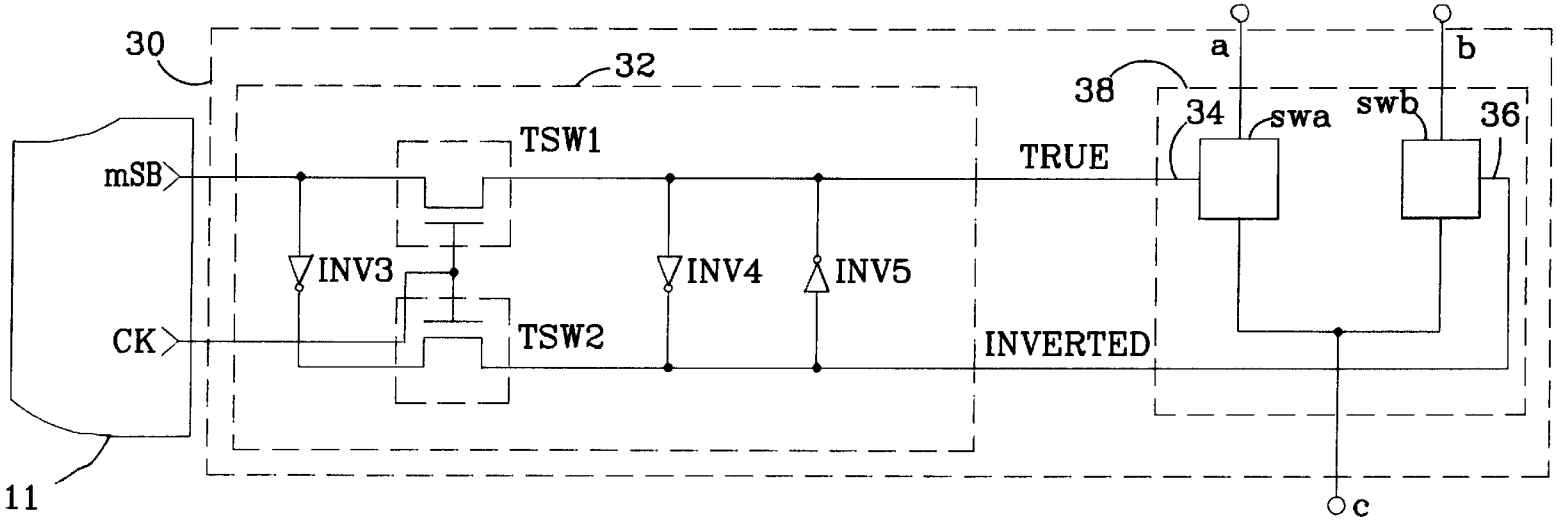
FIG. 4 is a schematic diagram of one implementation of the novel differential switch which employs cross-coupled inverters as storage elements.

An implementation of the novel switch 30 is illustrated in FIG. 4, employing P-channel FETs as transfer switches TSW1 and TSW2 within latch 32. Weak cross-coupled inverters INV4 and INV5 serve as storage elements 40 and 42. As noted in the background section above, cross-coupled inverters are known in the art and, briefly, have two stable states which they may assume. Once forced into one of those states, they will maintain it. Because the two states desired for the differential switch control terminals 34 and 36 coincide with the two states available from the cross-coupled inverters, the inverters provide the functions of storage elements 40 and 42, although they are not independent storage elements in the sense of a pair of memory cells, and cannot store binary patterns corresponding to the (undesirable) states which would simultaneously turn both switches swa and swb "on" or "off". As described in greater detail in relation to FIG. 6, the inverters INV4 and INV5 are "weak" in that they have limited drive current capability and therefore may be easily forced, by whatever device drives the MSB input and the inverter INV3, into a desired state.

Alternatively, a pair of cross-coupled inverters INV6 and INV7, one of which (INV7) is a gated inverter, may be employed, as a storage element, as illustrated in FIG. 5A, with one pair for each storage element 40 and 42. As will be described, this implementation eliminates the need for weak inverters. The inverter INV3, inputs MSB and ck and outputs TRUE and INVERTED are as described in relation to FIG. 3. In this implementation, the storage elements 40 and 42 are identical; the detailed description given below for storage element 40 will also apply to storage element 42.

A signal ck is asserted to transfer a single-bit signal MSB through a transfer switch TSW1, when MSB is valid, to the input of inverter INV6. A signal ckb, the non-over-lapping inverse of ck, opens switch SWI1 when ck closes TSW1. The switch SWI1 is connected between the output of the inverter INV7 and the input of the inverter INV6. Consequently the output of the inverter INV7 is isolated from the device driving the input of the inverter INV6 and, because there is no contention between the output of INV7 and the device driving the input of inverter INV6, inverters INV6 and INV7 needn't be "weak" inverters. When the ck input is "de-asserted", transfer switch TSW1 opens and switch SWI1 closes. During the short time that neither switch is closed, stray capacitance maintains the state of inverter INV6 until the switch SWI1 closes. With switch SWI1 closed, the inverter INV7 provides positive feedback to the inverter INV6, thereby "latching" the inverters and providing the TRUE and INVERTED control signals for the differential switch control terminals 34 and 36 (not shown). In some applications, the differential switch pair requires more drive current than "weak" inverters may provide. Employing standard inverters and the additional switch SWI1 as illustrated in FIG. 5A eliminates buffers which would otherwise be required to drive the differential switch pair 38.

Similarly, FIG. 5B illustrates an implementation of the storage element 40 (also applicable to storage element 42) which employs a gated inverter 46 to achieve the same isolation between the input to the inverter INV6 and the output from a feedback inverter, in this case, gated inverter 46. This isolation is achieved, as described below, by causing the output of the inverter 46 to "float". The input to inverter INV6 is the switched data input, i.e. the input to the storage element 40, and its output TRUE drives the differential switch control inputs 34, as illustrated in FIGS. 3 and 4 above. The gated inverter 46, illustrated in detail in FIG. 5C, is cross-coupled with the inverter INV6. The same advantage accrues to the use of a gated inverter in this implementation as the use of the inverter switch SWI1 in the implementation of FIG. 5A, i.e., the cross-coupled inverters needn't be weak inverters and, therefore, buffers which otherwise may be required to drive the differential switch pair's control terminals 34 and 36 may be eliminated.

The gated inverter 46 shown in FIG. 5C is controlled by the control signals ck and ckb previously identified. The inverter 46 is composed of two n-channel FETs, n1 and n2, and two p-channel FETs, p1 and p2. FETs n2 and p1 are connected as a conventional CMOS inverter, FETs n1 and p2 are connected in series between the inverter formed by n2 and p1 and positive and negative supplies $V^+$ and V, respectively. When the ck signal is asserted (driven HIGH), transferring the MSB signal into storage element 40, it also forces p2 into a non-conducting state. At the same time ckb is driven LOW, forcing n1 into a non-conducting state. The inverter is "floating" in this state and whatever device drives the input to inverter INV6 can also drive the output of gated inverter 46 without contention from the gated inverter 46.

When ck is de-asserted, after the binary value from MSB has been transferred to the input of the inverter INV6, FETs n1 and p2 are turned on, thereby providing supply voltages to the inverter 46. At this point the input 50 to the gated inverter 46 will be driven to the updated level by the output of inverter INV6, and the output 48 of the gated inverter 46 will drive the input of the inverter INV6 to the same level transferred to it by the transfer switch TSW1. In this way an updated value of MSB is transferred to the input of the inverter INV6 without contention from the output of the gated inverter 46. This value is then latched, through positive feedback from the gated inverter 46, at the output of the storage element 40.

In some applications, notably those employing a DAC in waveform reconstruction, the DAC's differential switches' data inputs, LSB 14–MSB 18, are rapidly updated. As illustrated in FIG. 5D, a capacitor C1 of sufficient capacity to hold its value throughout an individual switch's longest update period, i.e. the longest period during which transfer switch TSW1 is left open, could be used as a storage element 40. After transfer switch TSW1 charges the capacitor C1 to the binary value present at MSB, it opens so that only leakage paths are available to charge or discharge the capacitor C1 (assuming that C1 drives a high impedance input). So long as the voltage across the capacitor does not fall to the following device's low input threshold before being recharged, the capacitor can serve as a storage element. It may be necessary to buffer the capacitor C1, if, for example, storage element 40 is to drive one of the differential switch pair 38 of FIG. 4 and the pair 38 comprises bipolar transistors. This may be accomplished using an inverter INV8 which provides sufficient drive current for one of the differential switch control terminals 34 or 36.

Figure 2B:
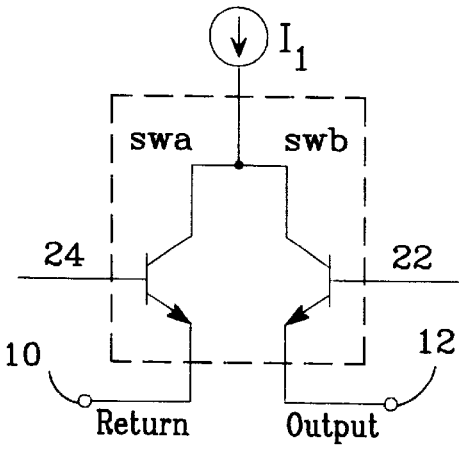
FIG.2B (Prior Art)
FIG. 2B described above, is a schematic diagram of an PNP transistor implementation of the differential switch block of FIG. 2A.
Figure 2C:
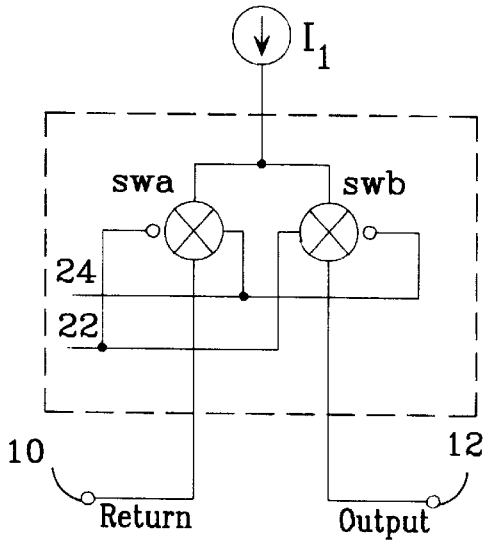
FIG.2C (Prior Art)
FIG. 2C described above, is a schematic diagram of an analog switch implementation of the differential switch block of FIG. 2A.
Figure 2A:
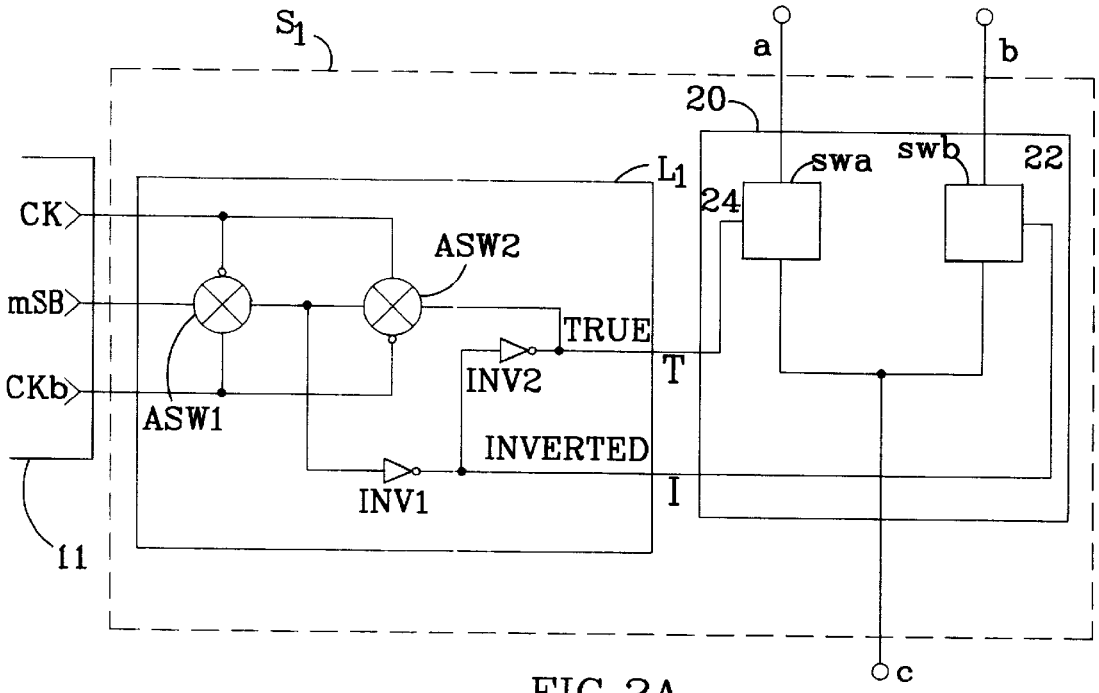
FIG.2A (Prior Art)
FIG. 2A described above, is a schematic diagram of one of the differential switches of FIG. 1.
Figure 6:
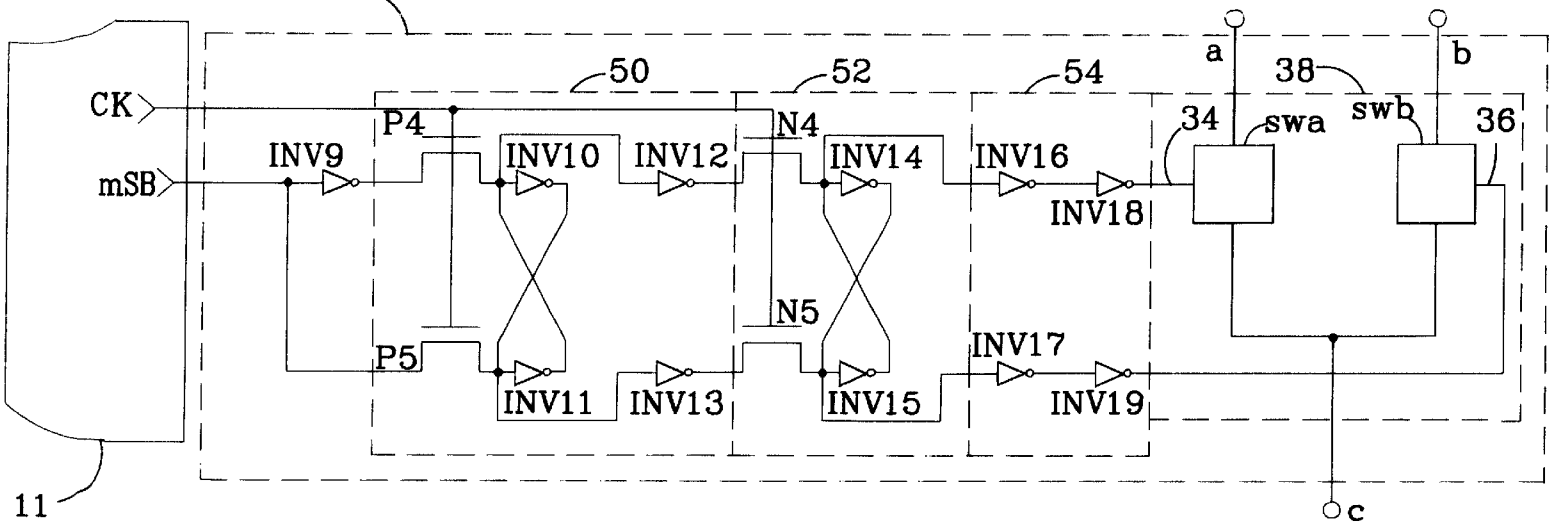
FIG. 6 is a schematic diagram of a preferred master/slave embodiment of the novel switch.

In a preferred embodiment, the novel switch 30 employs a master/slave architecture, as illustrated by the schematic of FIG. 6. All the inverters employed within this preferred embodiment are CMOS inverters, the relative strengths of which will be discussed below. A master latch 50 latches control signals during a first phase of the enable input ck. Then, during the second phase of ck, these signals are transferred to a slave latch 52. As described in relation to FIG. 2A above, the master/slave architecture provides greater flexibility in re-loading the latches, in that the data value of the input MSB need be valid for only a short time around the transition of the enable signal ck. A buffer section 54 which follows the slave latch 52 increases the drive capability over that of the slave latch 52. The outputs of the buffer section drive the control inputs 34 and 36 of the differential switch pair swa and swb which, in the preferred embodiment, are p-channel FETs.

The switch 30 accepts an enable signal at an input ck and data at an input MSB. Within a DAC, the data appearing at the input MSB would represent one bit of a digital code which is to be converted into an analog output. Data appearing at the MSB input is inverted by a CMOS inverter INV9 and the true and complement signals thus formed are passed through switches P5 and P4, respectively, when the signal ck goes low. In this embodiment, switches P5 and P4 are p-channel FETs. Inverters INV10 and INV11 form a cross-coupled weak inverter "master" latch that accepts signals passed through the switches P5 and P4. A pair of inverters INV12 and INV13 buffer the outputs from the latch.

When the enable signal ck goes high, n-channel MOSFET switches N4 and N5 pass the outputs from the buffers INV12 and INV13 to a "slave" latch formed by cross-coupled weak inverters INV14 and INV15. At the same time switches P4 and P5 turn off, thereby isolating the master latch from the MSB signal and its complement. The INVERTED and TRUE outputs from the slave latch are buffered by inverters INV16 and INV18 connected in series and INV17 and INV19 connected in series, respectively. The buffer inverters INV18 and INV19 drive the control terminals 34 and 36 of the differential switch pair 38. In the preferred embodiment, switches swa and swb are p-channel MOSFETs. Since the signal at the MSB input is complemented before being latched, the skew created by the delay of inverter INV9 is eliminated during the latching process. Consequently, a single binary signal is converted into de-skewed differential switch pair control signals available to drive inputs 34 and 36.

To accommodate the difference in mobility between holes and electrons, the size (i.e., channel width to length ratio) of the p-channel FET within each inverter INV9-INV17 is preferably about 3.2 times that of the corresponding n-channel FET, and the p-channel FETs of inverters INV18 and INV19 are about twice the size of their corresponding n-channel FETs. Additionally, the channel widths of the weak inverters, (INV10, INV11, INV14 and INV15) are approximately 0.4 that of the other inverters. This allows the devices which drive the weak inverters to do so with little contention from the weak inverters.

The forgoing description of specific embodiments of the invention has been presented for the purposes of illustration and description. It is not intended to be exhaustive or to limit the invention to the precise forms disclosed, and many modifications and variations are possible in light of the above teachings. For example, the novel switches may be employed within a DAC which is itself a part of an analog to digital converter, such as a successive approximation converter. The embodiments were chosen and described in order to best explain the principles of the invention and its practical application, to thereby enable others skilled in the art to best utilize the invention. It is intended that the scope of the invention be limited only by the claims appended hereto.

We claim:

1. A skewless differential switch, comprising:

a control input for receiving a control signal, an inverter that is coupled to said control input to produce a complement of said control signal which is skewed with respect to said control signal, an enable input for receiving a clock signal,

[a plurality of storage elements,]

*a differential switch pair having complementary control inputs,*

[a pair of] *first and second* transfer switches responsive to said clock signal [that are], *each of said transfer switches having first and second switch terminals, said first switch terminals* connected [between] *to* said control [input] *signal* and said [inverter] *complement of said control signal*, respectively, and *said second switch terminals directly connected to respective ones of* said *complementary control inputs, and*

[storage elements to isolate] *a plurality of storage elements connected to said second switch terminals in parallel with said direct connections between said second switch terminals and said differential switch pair, said transfer switches isolating* said control [input] *signal and its complement* from said storage elements *and the complementary control inputs* and, once per clock period, simultaneously transfer*ring* the control signal and its complement through the*ir* respective switches to the storage elements *and the complementary control inputs*, said storage elements [also] connected to store said [signals] *transferred control signal and its complement* and to provide de-skewed complementary output signals *to said complementary control inputs* having the same binary values as the control signal and its complement stored within said storage elements[, and a differential switch pair having complementary control inputs that are connected to receive said pair of de-skewed complementary output signals from said storage elements] so that said differential switch pair is controlled by said control input without skew.

2. The switch of claim 1, further comprising a intermediate switch pair and intermediate storage element pair that are interposed between said control input and said inverter and said [pair of] *first and second* transfer switches such that, said intermediate switch pair provides a transmission path from said control input and said inverter to different ones of said intermediate storage elements in response to said clock signal, and said intermediate storage elements are connected to receive said control and complement signals through said intermediate switches, store said signals and provide output signals to said [pair] *first and second* transfer switches having the same values as the respective signals stored with*in* said intermediate storage elements.

3. The switch of claim 1, wherein said differential switch pair comprises two FETs connected in a differential configuration.

4. The switch of claim 1, wherein said differential switch pair comprises two CMOS transmission gates connected in a differential configuration.

5. The switch of claim 1, wherein said differential switch pair comprises two bipolar transistors connected in a differential configuration.

6. The switch of claim 1, wherein said storage elements comprise [a pair of] *first and second* cross-coupled weak inverters*, the input and output of said first weak inverter connected to the second switch terminals of said first transfer switch and said second transfer switch, respectively, and the input and output of said second weak inverter connected to the second switch terminals of said second transfer switch and said first transfer switch, respectively*.

7. The switch of claim 1, wherein said storage elements comprise capacitors.

8. The switch of claim 1, wherein each said storage element comprises a pair of cross-coupled inverters, one weak and one strong, the output of said strong inverter is connected to one of said differential control inputs and the input of said strong inverter comprises said storage element input.

9. The switch of claim 8, wherein a switch having a switch control input connects the output of said weak inverter to the input of said strong inverter, said control input being connected to receive a signal which is a non-overlapping complement of said clock signal.

10. The switch of claim 8, wherein said weak inverter is a gated inverter that is enabled by a non-overlapping complement of said clock signal.

11. A digital to analog converter, comprising:

an analog output section, *and* a digital section having a binary output and an enable output connected to provide control over said analog output section, said analog output section comprising a differential switch [which connects a first or second conducting terminal to a third conducting terminal thereby producing an analog output, said differential switch further having a control input connected to said binary output and an enable input connected to said enable output], said differential switch [further] comprising[, an inverter connected to receive a signal from said control input and to produce a complement of said control signal, control and complement inputs for receiving a control signal and a complement of said control signal which may be skewed with respect to said control signal, an enable input, storage elements, switches connected to provide transmission paths under control of said enable input from each of said control and complement inputs to said storage elements, said storage elements also connected to store said signals and to provide de-skewed output signals having the same binary value as the respective signal stored within said storage elements, and a differentially connected switches having complementary control inputs, one of said differentially connected switch control inputs being connected to receive said control signal, and the other differentially connected switch control input being connected to receive said complement signal from another of said storage elements]:

*a control input connected to said binary output,*

*an inverter that is coupled to said control input to produce a complement of said binary output which is skewed with respect to said binary output,*

*an enable input connected to said enable output,*

*a differential switch pair having complementary switch control inputs, said differential switch pair connecting one of two conducting terminals to a third*

*conducting terminal depending upon the state of said complementary switch control inputs,*

*first and second transfer switches responsive to said enable input, each of said transfer switches having first and second switch terminals, said first switch terminals connected to said binary output and said complement of said binary output, respectively, and said second switch terminals directly connected to respective ones of said complementary switch control inputs, and*

*a plurality of storage elements connected to said second switch terminals in parallel with said direct connections between said second switch terminals and said differential switch pair, said transfer switches isolating said binary output and its complement from said storage elements and, once per clock period, simultaneously transferring the binary output and its complement through their respective switches to the storage elements and the complementary switch control inputs, said storage elements connected to store said transferred binary output and its complement and to provide de-skewed complementary output signals to said complementary switch control inputs having the same binary values as the binary output and its complement stored within said storage elements so that said differential switch pair is controlled by said binary output without skew.*

12. The digital to analog converter of claim 11, wherein [the] *said analog* output is a current output.

13. The digital to analog converter of claim 11, wherein [the] *said analog* output is a voltage output.

14. The digital to analog converter of claim 11, wherein said differential switch further comprises a intermediate switch pair and intermediate storage element pair, said intermediate switch and storage element pairs interposed between said control [and complement inputs and said first switch pair] *input and said inverter and said first and second transfer switches* such that:

said intermediate switch pair provides [a] *respective* transmission paths from [each of said inputs to one of said] *said control input and said inverter to respective ones of said* intermediate storage elements under control of said enable input, and said intermediate storage elements receive said [control] *binary output* and *binary output* complement signals [from said inputs] through said intermediate switches, store said signals and provide output signals to said first [switch pair] *and second transfer switches* having the same values as the respective signals stored within said intermediate storage elements.

15. The digital to analog converter of claim 14, wherein said [differentially connected switches] *differential switch pair* comprises two FETs connected in a differential configuration.

16. The [switch] *digital to analog converter* of claim 15, wherein said storage elements comprise a pair *of* cross-coupled weak inverters [pair].

17. A differential switch, comprising:

a control input for receiving a single binary control signal,

*an inverter that is coupled to said control input to produce a complement of said binary control signal which is skewed with respect to said binary control signal,* a latch which latches said *binary* control signal [thereby introducing a delay between the control signal and its complement] *and its complement* and then simultaneously transfers the *binary* control signal and its complement through a pair of transfer switches into a plurality of storage elements thereby eliminating the skew between the signals, and a pair of differentially connected switches with two control terminals that are *directly* connected to the storage elements *and to respective transfer switches* so that said pair of differentially connected switches are controlled by the single binary control signal without skew.

18. A digital to analog converter comprising:

an analog output section, a digital section having a binary output and an enable output connected to provide control of said analog output section, said analog output section comprising a differential switch [which connects a first or second conducting terminal to a third conducting terminal thereby producing an analog output], said differential switch [further] comprising[,]*:*

*an inverter that is coupled to said binary output to produce a complement of said binary output which is skewed with respect to said binary output,* control and complementary inputs for receiving [a control signal] *said binary output* and its complement, a latch [having control and complementary inputs] *having two outputs* which latches said [control] *binary output* and *its* complement[ary signals] *and* simultaneously [, said latch having two outputs, and] *transfers the binary output and its complement through a pair of transfer switches into a plurality of storage elements thereby eliminating the skew between the signals, and* a pair of differentially connected switches with two control terminals, said *differentially connected* switches connecting one of two conducting terminals to a third conducting terminal[,] depending upon the state of the control terminals, said control terminals being *directly* connected to *respective ones of* said [latch outputs] *transfer switches*.

19. The digital to analog converter of claim 18, wherein [each of] said differential switch[es] further comprises an intermediate latch interposed between said control and complement inputs and said latch, said intermediate latch connected to simultaneously latch said control and complement inputs under control of an enable input, and to provide latched control and complementary signals to said control and complementary inputs of said latch.

20. The digital to analog converter of claim 19, wherein said differentially connected switches comprise two FETs connected in a differential configuration.

*21. A skewless differential switch, comprising:*

*complementary signal sources,*

*a differential switch pair having complementary control inputs,*

*a pair of transfer switches, each of said switches completing a direct transmission path between a respective one of said complementary signal sources and a respective one of said complementary control inputs when closed in response to a common clock signal, and*

*a plurality of storage elements connected to said complementary control inputs, said common clock signal closing said transfer switches substantially simultaneously such that said switches transfer said comple-*

*mentary signal sources to said complementary control inputs de-skewed, said storage elements arranged to maintain the binary values of said complementary signal sources on said complementary control inputs when said transfer switches are open.*

*22. A skewless differential switch, comprising:*

*first and second transfer switches, each of said switches having first and second switch terminals and arranged to provide a conductive path between said first and said second switch terminals when closed in response to a common clock signal,*

*a differential switch pair having complementary control inputs, said first terminals of said first and second transfer switches connected to receive a control bit and its complement, respectively, and said second terminals of said first and second transfer switches directly connected to respective ones of said complementary control inputs via first and second transmission paths, and*

*a plurality of storage elements connected to said second terminals of said first and second transfer switches in parallel with said first and second transmission paths, said transfer switches simultaneously transferring said control bit and its complement through their respective switches to said storage elements and said complementary control inputs in response to said common clock signal, said storage elements arranged to maintain the binary values of said transferred control bit and its complement on said complementary control inputs when said transfer switches are open.*

*23. The switch of claim 22, wherein said first and second transfer switches comprise first and second field-effect transistors (FETs), said first and second FETs' drain and source terminals providing said first and second switch terminals for said first and second switches, respectively, said FETs' gate terminals connected together to receive said common clock signal.*

*24. The switch of claim 22, wherein said storage elements comprise first and second cross-coupled inverters, the input and output of said first inverter connected to the second switch terminals of said first transfer switch and said second transfer switch, respectively, and the input and output of said second weak inverter connected to the second switch terminals of said second transfer switch and said first transfer switch, respectively.*

*25. The switch of claim 22, further comprising an inverter connected to said control bit and providing said control bit's complement.*

* * * * *